United States Patent
Veeraraghavan et al.

(10) Patent No.: US 6,953,738 B2
(45) Date of Patent: Oct. 11, 2005

(54) METHOD AND APPARATUS FOR FORMING AN SOI BODY-CONTACTED TRANSISTOR

(75) Inventors: Surya Veeraraghavan, Austin, TX (US); Yang Du, Austin, TX (US); Glenn O. Workman, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/734,435

(22) Filed: Dec. 12, 2003

(65) Prior Publication Data

US 2005/0127442 A1 Jun. 16, 2005

(51) Int. Cl.[7] ............................ H01L 21/20; H01L 21/84
(52) U.S. Cl. ....................... 438/479; 438/151; 438/298; 438/517
(58) Field of Search ................................ 438/149, 479, 438/517, 282, 298, 910, 152–156, 164, 309, 311, 412; 257/347–354

(56) References Cited

U.S. PATENT DOCUMENTS 6,620,656 B2   9/2003   Min et al.

OTHER PUBLICATIONS

Matloubian, "Smart Body Contact for SOI MOSFETs," *IEEE SOI Conference*, 1989, pp. 128–129.

*Primary Examiner*—Hung Vu
(74) *Attorney, Agent, or Firm*—Michael J. Balconi-Lami; Robert L. King

(57) ABSTRACT

A method for forming a silicon-on-insulator transistor (80) includes forming an active region (82) overlying an insulating layer (122), wherein a portion of the active region provides an intrinsic body region (126). A body tie access region (128) is also formed within the active region, overlying the insulating layer and laterally disposed adjacent the intrinsic body region, making electrical contact to the intrinsic body region. A gate electrode (134) is formed overlying the intrinsic body region for providing electrical control of the intrinsic body region, the gate electrode extending over a portion (137) of the body tie access region. The gate electrode is formed having a substantially constant gate length (88) along its entire width overlying the intrinsic body region and the body tie access region to minimize parasitic capacitance and gate electrode leakage. First and second current electrodes (98,100) are formed adjacent opposite sides of the intrinsic body region. In addition, a body tie diffusion (130) is formed within the active region and laterally offset from the body tie access region and electrically coupled to the body tie access region.

12 Claims, 8 Drawing Sheets

FIG. 2 —PRIOR ART—

METHOD AND APPARATUS FOR FORMING AN SOI BODY-CONTACTED TRANSISTOR

BACKGROUND

The present disclosure relates generally to semiconductor devices, and more particularly, to a method and apparatus for forming an SOI body-contacted transistor.

RELATED ART

Body-contacted SOI transistors are typically built with a polysilicon gate separating the source/drain regions from the body contact region. The additional circuit loading capacitance due to this body-tie gate is substantial, especially for high-performance technologies that use reticle enhancement techniques such as complementary phase-shift masks to reduce the main transistor gate length. Such techniques are unable to reduce the size of the body-tie region or capacitance.

In the prior art, polysilicon gates are used to separate the source/drain regions from the body contact region. Such a layout produces additional gate capacitance sufficient to increase the gate delay, for example, by a factor of 2. In addition, while the use of a dual-gate oxide process in the body-tie gate reduces a capacitance per unit area somewhat, it however does not reduce the physical size of the body-tie gate. Furthermore, the use of the dual gate oxide process does not provide any mechanism to reduce the physical size of the body-tie area, such as, using reticle enhancement techniques.

FIG. 1 is a layout view of a typical SOI body-contacted transistor 10. SOI body-contacted transistor 10 includes an active transistor region 12, wherein active transistor region 12 includes a portion thereof for use as a body tie contact region, as indicated by reference numeral 14. An intrinsic body region, proximate a center of the active transistor region 12, includes a width dimension 16, designated as "$W_1$," and a length dimension 18, designated as "$L_1$." An extrinsic body region, proximate a center of the body tie region 14, includes a width dimension 20, designated as "$W_2$," and a length dimension 22, designated as "$L_2$."

SOI body-contacted transistor 10 further includes a gate polysilicon 24 overlying the active transistor region 12. The gate polysilicon 24 further includes a portion 26 thereof that overlies a portion of the body tie contact region 14 corresponding to the extrinsic body region. SOI body-contacted transistor 10 still further includes a source silicide 28, drain silicide 30, and body tie contact region silicide 32. In addition, the structure of transistor 10 includes implant regions, designated by reference numerals 34 and 36. In one embodiment, the implant regions 34 and 36 correspond to N++ and P++ implant regions, respectively. Contacts 38, 40, 42, and 44 provide electrical connection to the gate, source, drain, and body tie regions, respectively.

FIG. 2 is a cross-sectional view 50 of the typical SOI body-contacted transistor 10 of FIG. 1, taken along line 2—2. Transistor 10 includes an insulator 52, trench isolation 54, intrinsic body of the active region 56, extrinsic body tie access region 58, and body tie diffusion 60. As shown, intrinsic body of the active region 56 includes a P type region, extrinsic body tie access region 58 includes a P-type region, and body tie diffusion 60 includes a P++ region. During device operation, a depleted portion of the extrinsic body tie access region, designated by reference numeral 62, is formed within the extrinsic body tie access region 58. The depleted portion of the extrinsic body tie access region causes a higher body tie resistance condition, resulting in a degraded body tie efficiency.

A thin gate oxide 64 overlies the active transistor region 12 in an area underlying gate polysilicon 66. Gate polysilicon 66 includes an N++ portion 68 and a P++ portion 70, resulting from N++ and P++ implantations in regions 34 and 36, repectively, after sidewall spacer formation. Sidewall spacers 72 are formed at end regions of the gate polysilicon 66. Silicidation forms silicides 24 and 32. Subsequently, an interlevel dielectric $ILD_0$, indicated by reference numeral 74, is formed overlying the transistor structure, followed by formation of contacts 38 and 44.

Accordingly, there is a need for an improved method and apparatus for overcoming the problems in the art as discussed above.

SUMMARY

According to one embodiment of the present disclosure, a method for forming a silicon-on-insulator transistor includes forming an active region overlying an insulating layer, wherein a portion of the active region provides an intrinsic body region. A body tie access region is also formed within the active region, overlying the insulating layer and laterally disposed adjacent the intrinsic body region, making electrical contact to the intrinsic body region. A gate electrode is formed overlying the intrinsic body region for providing electrical control of the intrinsic body region, the gate electrode extending over a portion of the body tie access region. In one embodiment, the gate electrode is formed having a substantially constant gate length along its entire width overlying the active region, with a portion overlying the body tie access region having a gate length substantially smaller than $L_2$, to minimize parasitic capacitance and gate electrode leakage. First and second current electrodes are formed adjacent opposite sides of the intrinsic body region. In addition, a body tie diffusion is formed within the active region and laterally offset from the body tie access region and electrically coupled to the body tie access region.

BRIEF DESCRIPTION OF THE DRAWINGS

The present invention is illustrated by way of example and not limited by the accompanying figures, in which like references indicate similar elements, and in which.

DETAILED DESCRIPTION

Figure 1:
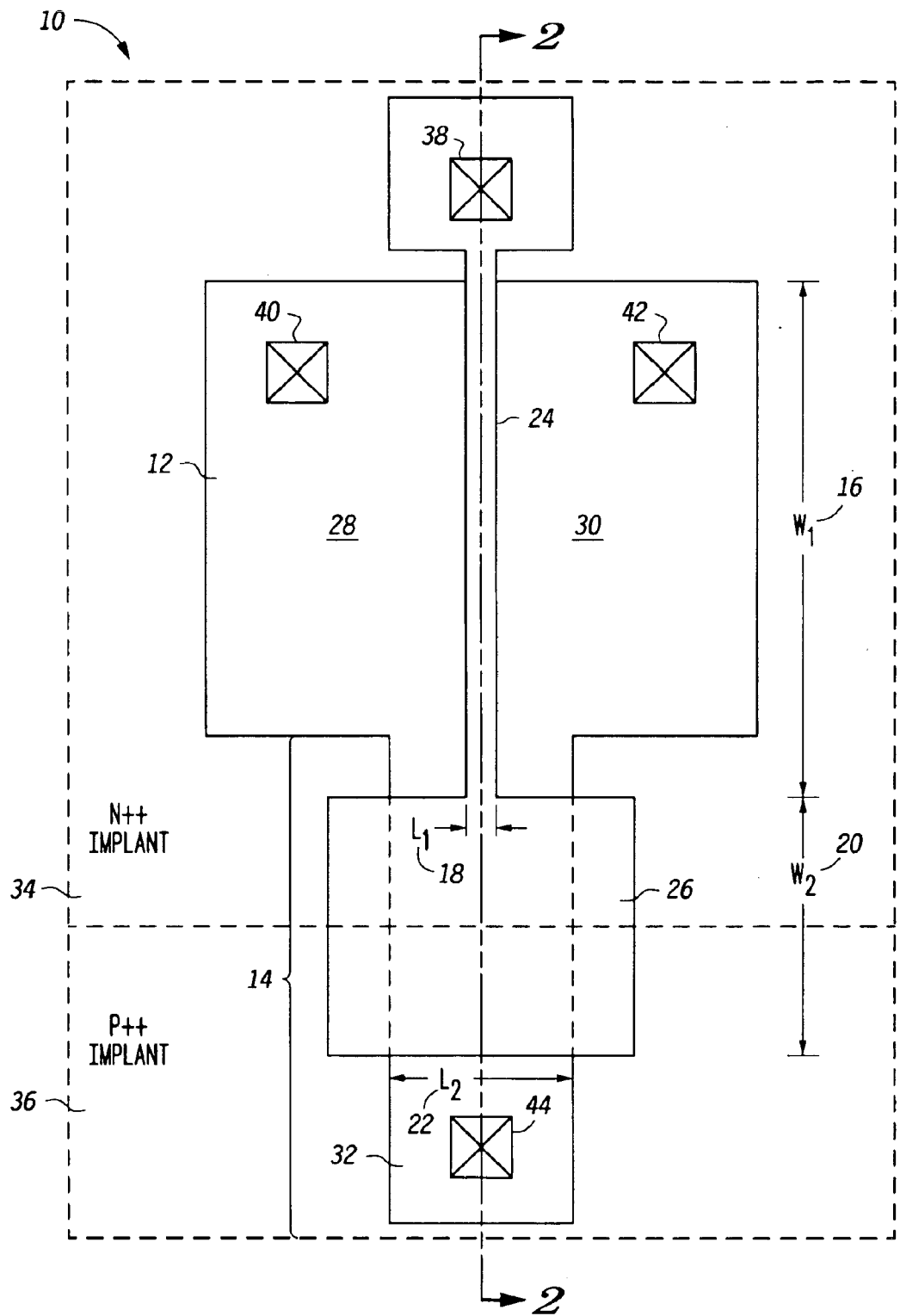
FIG. 1 is a layout view of a typical SOI body-contacted transistor (PRIOR ART)
Figure 2:
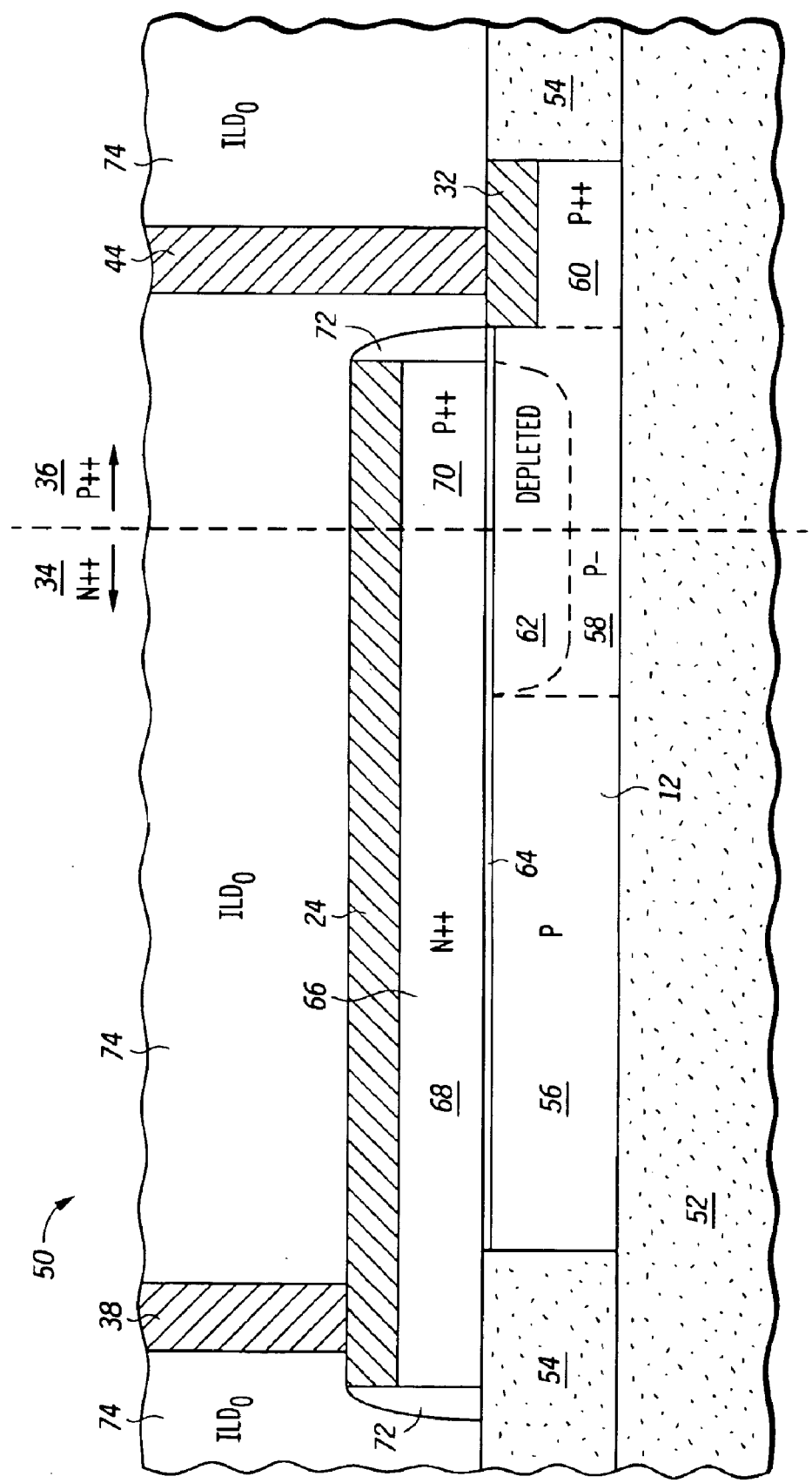
FIG. 2 is a cross-sectional view of the typical SOI body-contacted transistor of FIG. 1, taken along line 2—2 (PRIOR ART)
Figure 3:
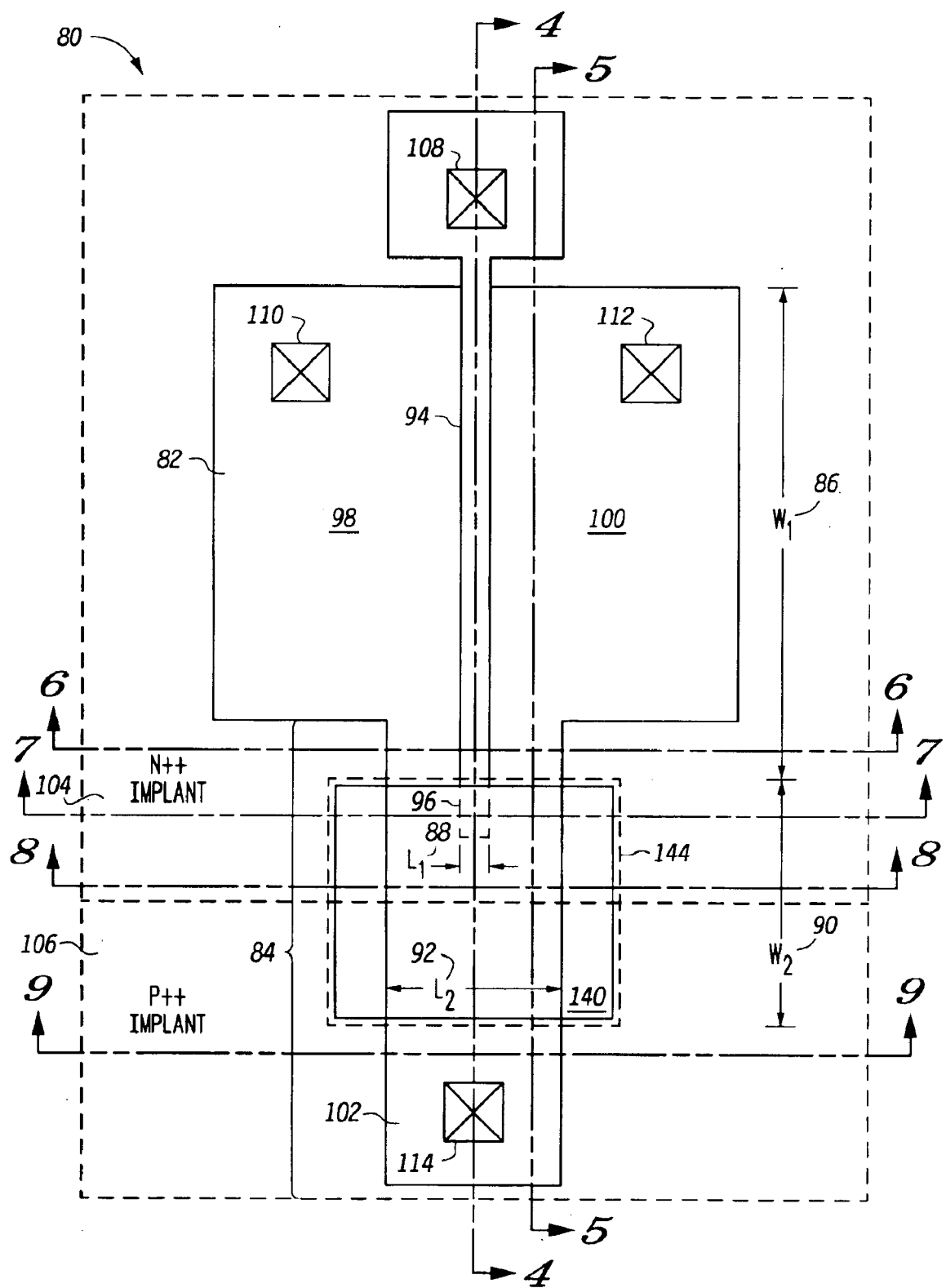
FIG. 3 is a layout view of a novel SOI body-contacted transistor according to an embodiment of the present disclosure.

FIG. 3 is a layout view of a novel SOI body-contacted transistor 80 according to an embodiment of the present disclosure. SOI body-contacted transistor 80 includes an active transistor region 82, wherein active transistor region 82 includes a portion thereof for use as a body tie contact region, as indicated by reference numeral 84. An intrinsic body region, proximate a center of the active transistor region 82, includes a width dimension 86, designated as "$W_1$," and a length dimension 88, designated as "$L_1$." A portion of the active region, proximate a center of the body tie region 84, includes a width dimension 90, designated as "$W_2$," and a length dimension 92, designated as "$L_2$." This region corresponds to a body tie access region and is designated by reference numeral 128 in FIGS. 3 and 4.

Figure 4:
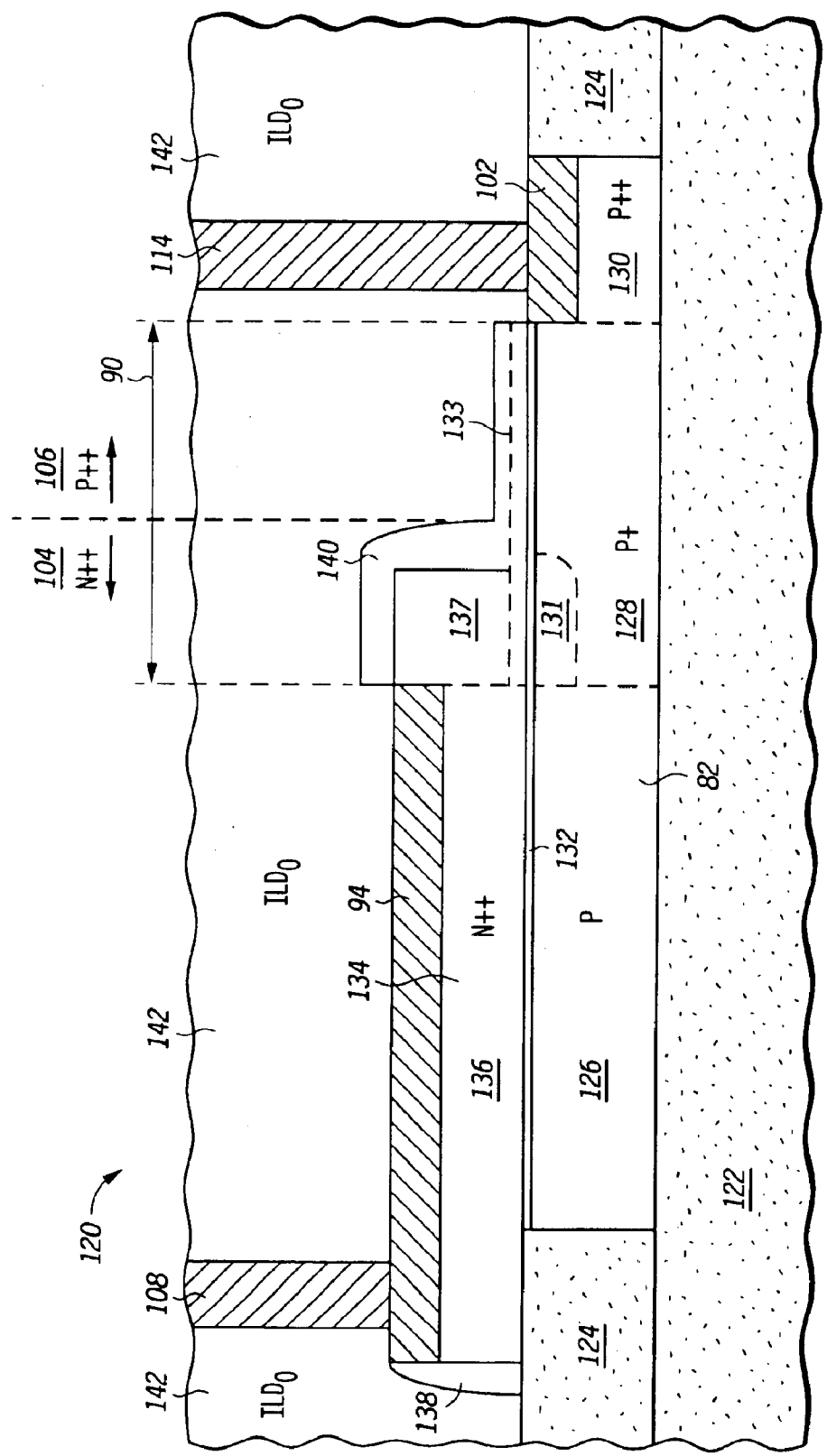
FIG. 4 is a cross-sectional view of the SOI body-contacted transistor of FIG. 3, taken along line 4—4.

SOI body-contacted transistor 80 further includes a gate polysilicon 94 overlying the active transistor region 82. The gate polysilicon 94 further includes a portion 96 thereof that overlies a portion of the body tie contact region 84 corresponding to the extrinsic body tie access region 128 (FIG. 4). Note that the portion 96 of the gate polysilicon that overlies the portion of the body tie contact region 84, and more particularly, the body tie access region 128 of the body tie contact region 84, has a length dimension that is substantially smaller than the length dimension of the body tie contact region 84 (in one embodiment, $L_1 \ll L_2$). Accordingly, the portion 96 of the gate electrode overlying the body tie access region substantially minimizes a parasitic capacitance and gate electrode leakage in the body tie structure. SOI body-contacted transistor 80 still further includes a source silicide 98, drain silicide 100, and body tie contact region silicide 102. In addition, the structure of transistor 80 includes implant regions, designated by reference numerals 104 and 106. In one embodiment, the implant regions 104 and 106 correspond to N++ and P++ implant regions, respectively. Contacts 108, 110, 112, and 114 provide electrical connection to the gate, source, drain, and body tie regions, respectively.

FIG. 4 is a cross-sectional view 120 of the SOI body-contacted transistor 80 of FIG. 3, taken along line 4—4. Transistor 80 includes an insulator 122, trench isolation 124, an intrinsic body 126 of the active region 82, a body tie access region 128 of the active region 82, and a body tie diffusion 130 of the active region 82. As shown, in one embodiment, the intrinsic body 126 of the active region 82 includes a P type region, body tie access region 128 includes a P+ type region, and body tie diffusion 130 includes a P++ region. During device operation, a depleted portion of an extrinsic body tie access region, designated by reference numeral 131, is formed within the body tie access region 128. The depleted portion 131 of the body tie access region 128 is minimized, thereby substantially reducing body tie access resistance and resulting in substantially improved body tie efficiency.

A thin gate oxide 132 overlies the active transistor region 82 in an area underlying gate polysilicon 134. Gate polysilicon 134 includes an N++ silicided portion 136 and an unsilicided portion 137, resulting from N++ implantation in region 104, after sidewall spacer formation. Sidewall spacers (138,140) are formed at end regions of the gate polysilicon 134. In one embodiment, sidewall spacers (138,140) include a dielectric. For example, the dielectric can include a silicon oxide, nitride, or other suitable dielectric. Subsequent silicidation forms silicides 94 and 102. Note that sidewall spacer 140 prevents a silicidation of a portion of the gate polysilicon 134 underlying a portion of the spacer 140. Still further, an interlevel dielectric $ILD_0$, indicated by reference numeral 142, is formed overlying the transistor structure, followed by formation of contacts 108 and 114.

As shown in FIG. 4, sidewall spacer 140 extends across the active region 82, in particular, the body tie access region 128, that corresponds to width $W_2$ designated by reference numeral 90 in FIG. 3. Furthermore, sidewall spacer 140 forms a hard mask having dimensions as outlined by dashed line designated by reference numeral 144 (FIG. 3), wherein a first dimension is on the order of $W_2$, designated by reference numeral 90 and a second dimension is on the order of greater than $L_2$, designated by reference numeral 92. In the second dimension, the hard mask overlies trench isolation 124 and the body tie access region 128.

Figure 5:
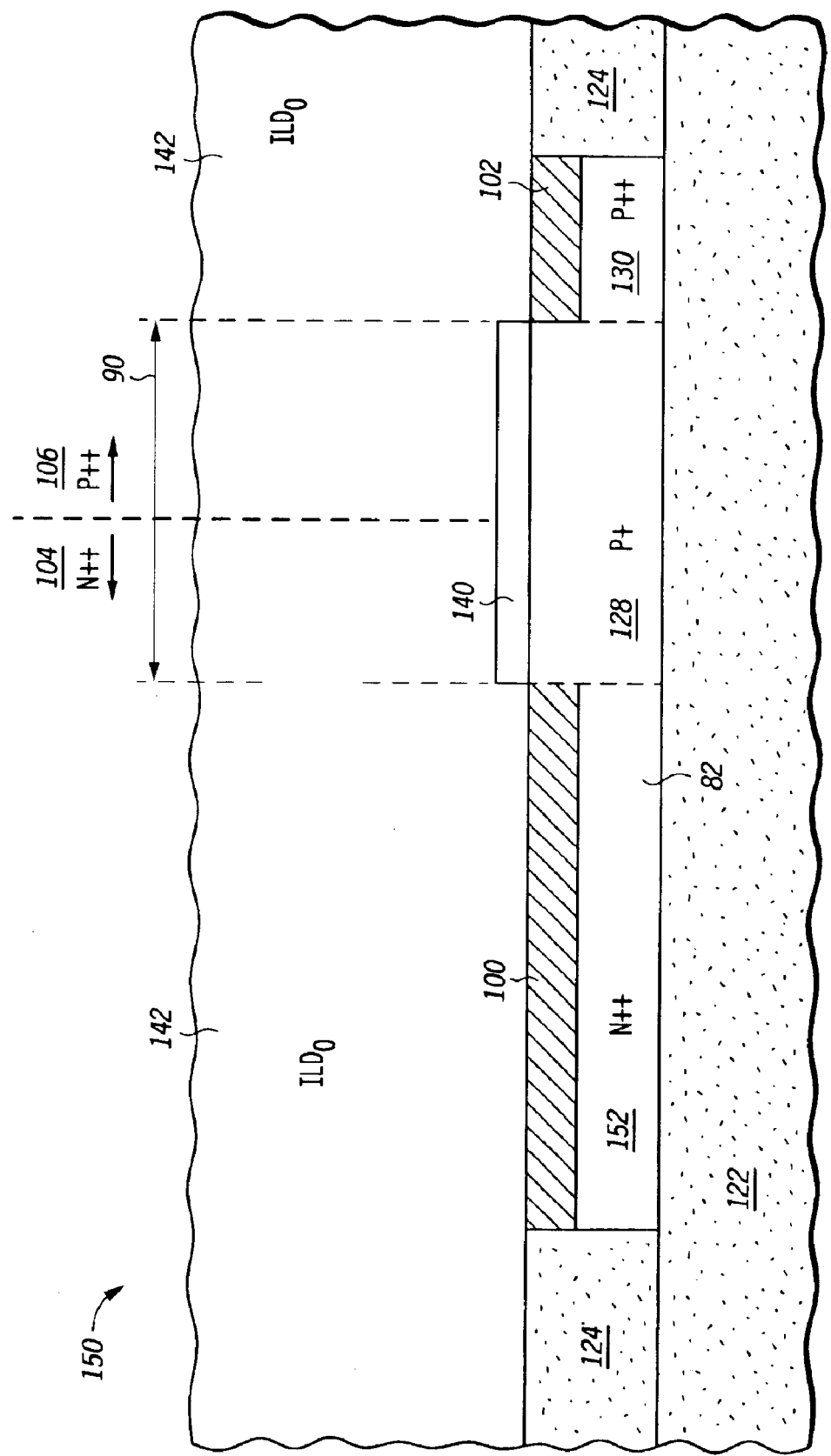
FIG. 5 is a cross-sectional view of the SOI body-contacted transistor of FIG. 3, taken along line 5—5.

FIG. 5 is a cross-sectional view 150 of the SOI body-contacted transistor 80 of FIG. 3, taken along line 5—5. As previously discussed, transistor 80 includes an insulator 122, trench isolation 124, and an active region 82. Transistor 80 further includes a drain region 152 of active region 82, a body tie access region 128 of the active region 82, and a body tie diffusion 130 of the active region 82. As shown, in one embodiment, the drain region 152 includes an N++ type region, body tie access region 128 includes a P+ type region, and body tie diffusion 130 includes a P++ region. As shown, a portion of sidewall spacer 140 overlies the body tie access region 128 along line 5—5 of FIG. 3. In addition, silicidation also forms silicide 100. Note that sidewall spacer 140 inhibits a silicidation of the active region 82 underlying the spacer 140.

Figure 6:
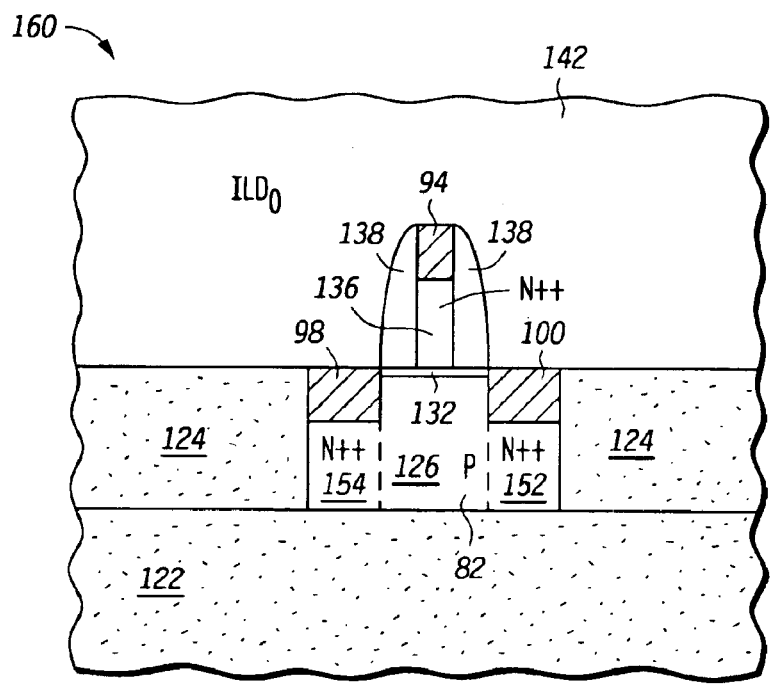
FIG. 6 is a cross-sectional view of the SOI body-contacted transistor of FIG. 3, taken along line 6—6.

FIG. 6 is a cross-sectional view 160 of the SOI body-contacted transistor 80 of FIG. 3, taken along line 6—6. As previously discussed, transistor 80 includes an insulator 122, trench isolation 124, and an active region 82. Transistor 80 further includes an intrinsic body region 126, a drain region 152 of active region 82, and a source region 154 of active region 82. As shown, in one embodiment, the drain and source regions 152 and 154, respectively, include N++ type regions. Further as shown, the gate polysilicon 136 includes an N++ type gate polysilicon and sidewall spacers 138 overlying gate oxide 132. In addition to silicide 100, silicidation also forms silicides 94 and 98.

Figure 7:
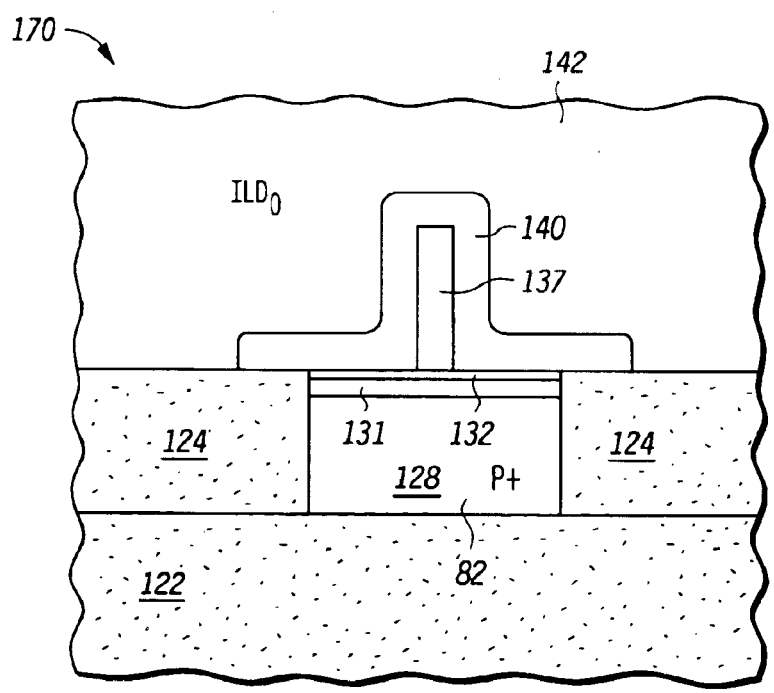
FIG. 7 is a cross-sectional view of the SOI body-contacted transistor of FIG. 3, taken along line 7—7.

FIG. 7 is a cross-sectional view 170 of the SOI body-contacted transistor 80 of FIG. 3, taken along line 7—7. As previously discussed, transistor 80 includes an insulator 122, trench isolation 124, an active region 82, and a body tie access region 128 of active region 82. As shown, in one embodiment, the body tie access region 128 includes a P+ type region. Further as shown, the unsilicided portion of gate polysilicon 137 and sidewall spacer 140 overlie gate oxide 132, wherein sidewall spacer 140 also overlies a portion of trench isolation 124. Note that sidewall spacer 140 inhibits a silicidation of the active region 82 underlying the spacer 140.

Figure 8:
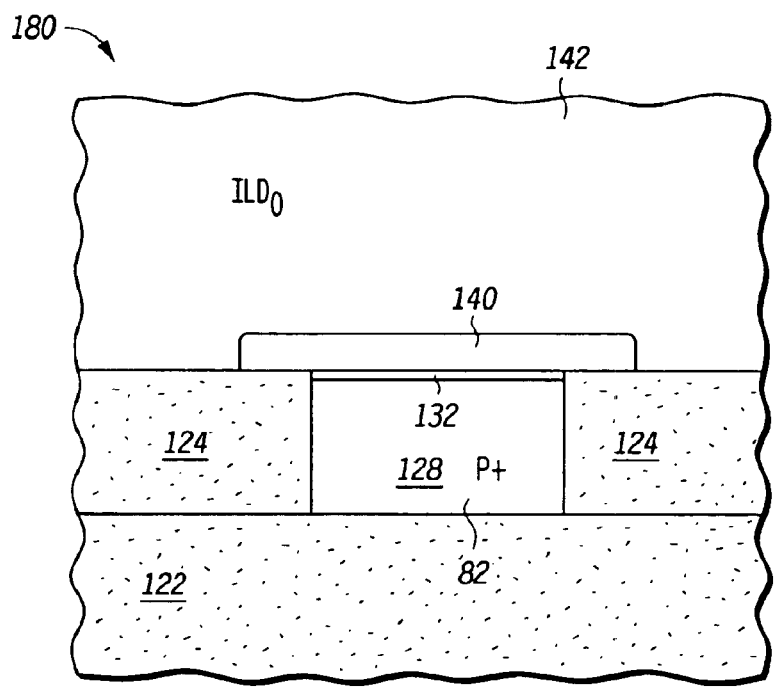
FIG. 8 is a cross-sectional view of the SOI body-contacted transistor of FIG. 3, taken along line 8—8.

FIG. 8 is a cross-sectional view 180 of the SOI body-contacted transistor 80 of FIG. 3, taken along line 8—8. As previously discussed, transistor 80 includes an insulator 122, trench isolation 124, an active region 82, and a body tie access region 128 of active region 82. As shown, in one embodiment, the body tie access region 128 includes a P+ type region. Further as shown, sidewall spacer 140 overlies gate oxide 132 and a portion of trench isolation 124. Note that sidewall spacer 140 inhibits a silicidation of the active region 82 underlying the spacer 140.

Figure 9:
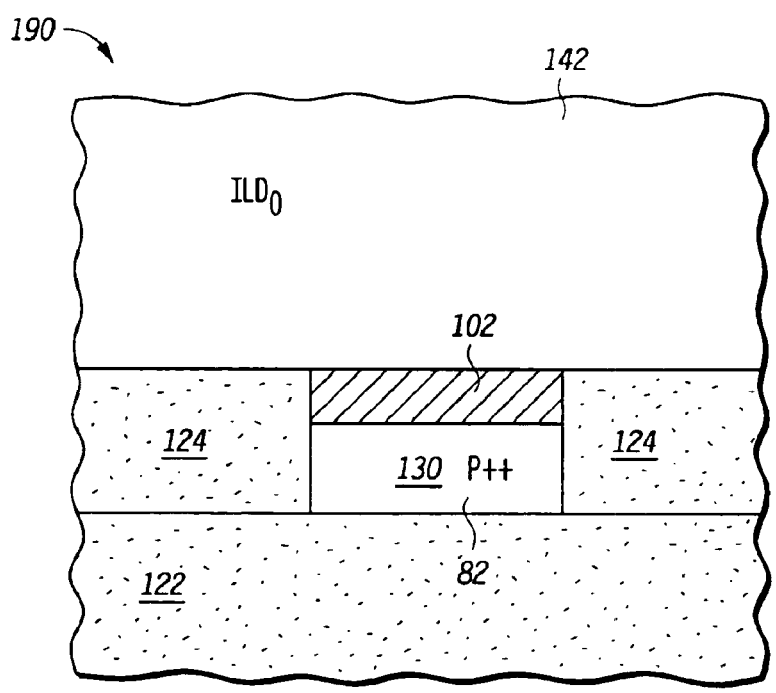
FIG. 9 is a cross-sectional view of the SOI body-contacted transistor of FIG. 3, taken along line 9—9.

FIG. 9 is a cross-sectional view 190 of the SOI body-contacted transistor 80 of FIG. 3, taken along line 9—9. As previously discussed, transistor 80 includes an insulator 122, trench isolation 124, an active region 82, and body tie diffusion 130 of active region 82. As shown, in one embodiment, body tie diffusion 130 includes a P++ region. Silicidation forms silicide 102 on the body tie diffusion 130.

Figure 10:
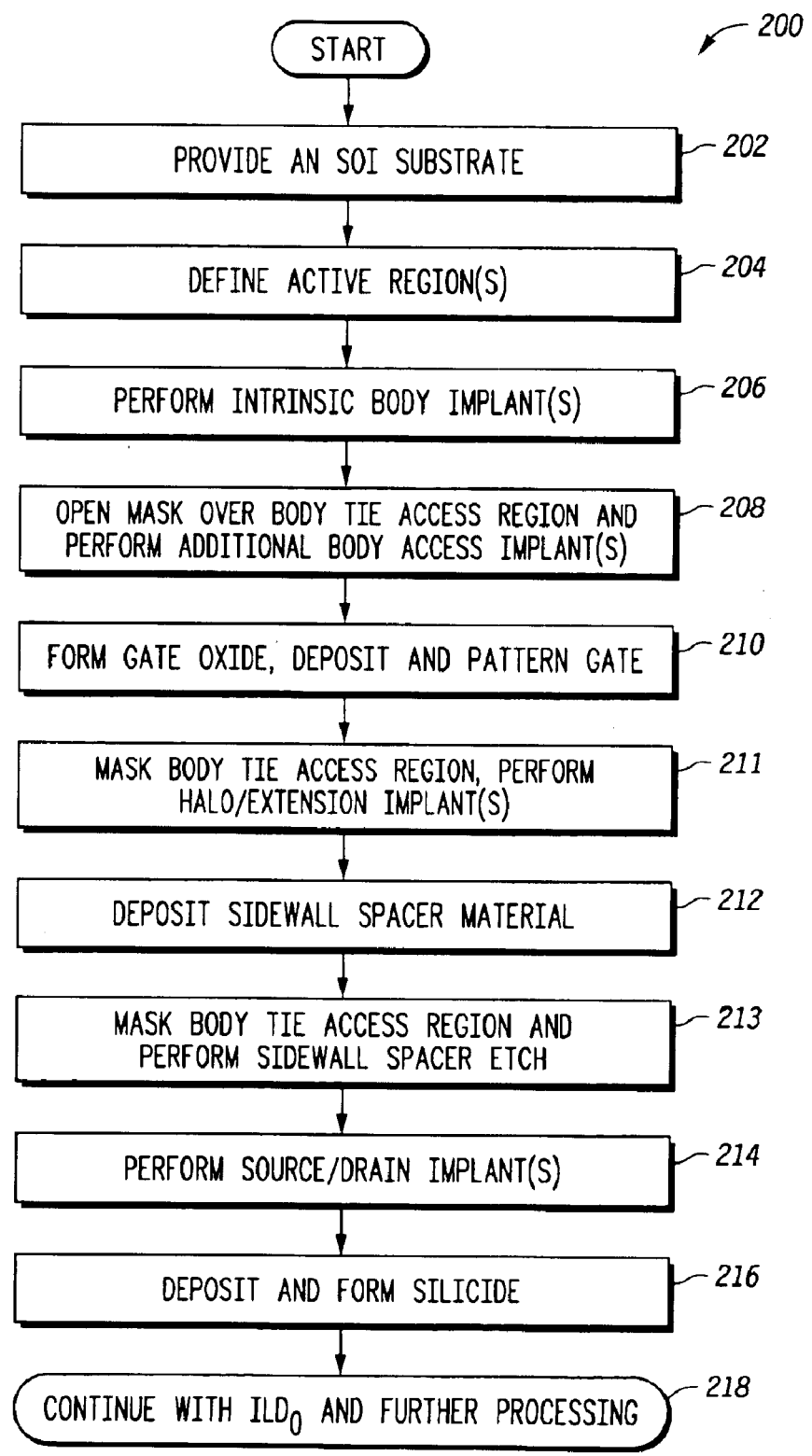
FIG. 10 is a flow diagram view of a method for fabricating the SOI body-contacted transistor according to an embodiment of the present disclosure.

FIG. 10 is a flow diagram view 200 of a method for fabricating the SOI body-contacted transistor according to an embodiment of the present disclosure. In step 202, the method begins by providing an SOI substrate. In step 204, an active region is defined (or active regions defined). In step 206, perform an intrinsic body implant or implants. In step 208, form an open mask over an intrinsic body tie region through mask Boolean and perform additional body access region implant(s). In step 210, form gate oxide(s), deposit and pattern gate electrode(s). In step 211, mask the body tie access region and perform halo/extension implant(s) (also referred to as pocket implant(s)). In step 212, deposit sidewall spacer material(s). In step 213, mask body tie access region(s) and perform sidewall spacer etch(es). In step 214, perform source/drain implant(s). In step 216, deposit and form silicide region(s). In step 218, continue with interlevel dielectric $ILD_0$ deposition and further processing according to the semiconductor IC flow.

The present disclosure includes various additional embodiments as discussed herein below. According to one embodiment, a silicon-on-insulator transistor 80 includes an insulating layer 122 and an active region 82 overlying the insulating layer. The active region 82 includes an intrinsic body region 126 and a body tie access region 128, the body tie access region also overlying the insulating layer 122 and being laterally adjacent the intrinsic body region 126. The body tie access region 128 provides for making electrical contact to the intrinsic body region 126. The SOI transistor 80 further includes a body tie diffusion 130 laterally offset from the body tie access region 128 and electrically coupled to the body tie access region 128.

Transistor 80 further includes a gate electrode 134. The gate electrode 134 overlies the intrinsic body region 126 for providing electrical control of the intrinsic body region 126 of the silicon-on-insulator transistor 80 and extends over a portion 137 of the body tie access region 128. The gate electrode 134 has a substantially constant gate length 88 along its entire width, wherein different portions of the gate electrode overlie the body tie access region 128 and the intrinsic body region 126. In addition, first and second current electrodes (98,100) are provided adjacent opposite sides of the intrinsic body region 126. In one embodiment, the gate electrode 134 extends over only a fraction of the body tie access region 128 to minimize parasitic gate capacitance and current leakage.

The silicon-on-insulator transistor 80 further includes a dielectric layer 140. The dielectric layer 140 overlies substantially all of the body tie access region 128 including the portion 137 of the gate electrode 134 that overlies the body tie access region 128. In one embodiment, the dielectric layer 140 functions as a sidewall spacer (138,140) of the gate electrode 134.

In another embodiment, a portion of the body tie access region 128 that underlies the dielectric layer 140 comprises doped material. The doped material increases a doping concentration of the body tie access region 128 so as to substantially minimize formation of a depletion region 131 in the body tie access region 128. Doping of the portion of the body tie access region can be provided by using a pattern feature 144 in a first mask and reusing the pattern feature in a second mask to provide the dielectric layer 140.

According to another embodiment, a method for forming a silicon-on-insulator transistor 80 includes providing an insulating layer 122 and forming an active region 82, a body tie access region 128, a gate electrode 134, first and second current electrodes (98,100), and a body tie diffusion 130 overlying the insulating layer 122. Forming an active region 82 includes forming the active region to overlie the insulating layer 122, wherein a portion of the active region 82 provides an intrinsic body region 126. Forming the body tie access region 128 includes forming a body tie access region 128 within the active region 82 and also overlying the insulating layer 122. The body tie access region 128 is also laterally adjacent the intrinsic body region 126 and makes electrical contact to the intrinsic body region 126.

Forming the gate electrode 134 includes forming a gate electrode overlying the intrinsic body region 126 for providing electrical control of the intrinsic body region 126 of the silicon-on-insulator transistor 80. The gate electrode 134 extends over a portion of the body tie access region 128, as indicated by reference numeral 137 in FIG. 4. In addition, the gate electrode 134 is formed to have a substantially constant gate length $L_1$ as indicated by reference numeral 88, along its entire width overlying the intrinsic body region 126 and the body tie access region 128. As a result, the gate electrode 134 maximizes transistor drive current capability and minimizes parasitic capacitance and gate electrode leakage. Still further, the method includes minimizing parasitic gate capacitance and current leakage by not extending the gate electrode 134 over the entire body tie access region 128.

In addition, first and second current electrodes (98,100) are formed adjacent opposite sides of the intrinsic body region 126. Subsequently, a body tie diffusion 130 is formed within the active region 82 and laterally offset from the body tie access region 128. Furthermore, the body tie diffusion 130 electrically couples to the body tie access region 128.

The method also includes forming a dielectric layer 140 overlying substantially all of the body tie access region 128, including the portion 137 of the gate electrode that overlies the body tie access region 128. In addition, a portion of the body tie access region 128 that underlies the dielectric layer 140 is doped to increase a doping concentration of the body tie access region 128 to substantially minimize formation of a depletion region 131 in the body tie access region. In one embodiment, the doping comprises using a pattern feature 144 in a first mask as a first selective block for the doping, and reusing the pattern feature 144 in a second mask as a second selective block, wherein the pattern feature is used to define the portion of the dielectric layer denoted by reference numeral 140.

In another embodiment of the present disclosure, a method of forming a silicon-on-insulator transistor includes forming an insulating substrate (202) and defining an active region 82 which defines a location of the silicon-on-insulator transistor 80. The active region 82 is implanted with a predetermined diffusion material to form an intrinsic body region 126 of desired doping concentration (206). The method further includes defining a body tie access region 128 by forming an opening in a mask overlying the active region 82, implanting the active region to form the body tie access region 128, the body tie access region having a predetermined doping concentration to minimize body tie access resistance.

A gate oxide (132,133) is then formed overlying both the intrinsic body region 126 and the body tie access region 128. The method continues with the depositing and patterning of gate electrode material 134 overlying the intrinsic body region 126 and a portion of the body tie access region 128. Subsequently, a region is defined by forming an opening in a mask overlying the active region 82, performing halo/extension implants of dopants into the intrinsic body region 126, while substantially blocking the dopants from the body tie access region 128. Sidewall spacer dielectric material (138,140) is then formed overlying the substantially constant length gate electrode material and body tie access region 128. Subsequently, a region substantially overlying the body tie access region 128 is masked, for example, using a suitable mask having an outline as indicated by dashed lines and reference numeral 144 (FIG. 3). The sidewall spacer dielectric material is then removed substantially everywhere except overlying the body tie access region 128 and adjacent the substantially constant length gate electrode material. Subsequently a source diffusion region 98, a drain diffusion region 100, and a body tie diffusion region 130 are formed.

In one embodiment, the method further includes forming electrical contacts to the source diffusion region (110), the drain diffusion region (112), the body tie diffusion (114) and to the substantially constant length gate electrode material (108). In one embodiment, forming electrical contacts includes forming a silicide layer overlying the source diffusion region (98), the drain diffusion region (100), the body tie diffusion (102) and over the substantially constant length gate electrode material (94).

In another embodiment, the method still further includes defining a dimension (144) of the mask (used for masking the body tie access region) to have a minimum distance necessary to prevent dopants implanted into the source diffusion region and the drain diffusion region from also being implanted into the body tie diffusion and vice versa.

Still further, according to another embodiment, the method includes depositing and forming a conductive material selectively overlying each of the source diffusion region, the drain diffusion region, the substantially constant length gate electrode material and the body tie diffusion region for making electrical contact thereto. In addition, the method includes defining a dimension of the mask to have a value substantially large enough to prevent electrical short circuiting by the silicide contacting each of the source diffusion region, the drain diffusion region, the body tie diffusion region and the substantially constant length gate electrode material.

In one embodiment, the gate oxide overlying the body tie access region 128 is formed to have a first thickness (132, 133) that is greater than a second thickness (132) of the gate oxide overlying the intrinsic body region 126 by using the mask. In another embodiment, the method further includes extending the substantially constant length gate electrode material 134 to overlie only a fraction of the body tie access region, for example, on the order of less than one-half.

Accordingly, the dielectric layer 140 separates the source and drain regions from the body contact region 130, by effectively providing a silicide-block layer, and thereby minimizes the extrinsic gate capacitance and gate leakage current in the body-contact access region 128, as well as the body contact region 130. In addition, the shape of the dielectric layer 140 can be combined (for example, via mask Boolean operations) into a high threshold voltage (Vt) PMOS channel implant mask; thereby minimizing an extrinsic body resistance.

The embodiments of the present disclosure advantageously provide an extension to existing high performance MOS SOI processes. The embodiments of the present disclosure also provide additional advantages, in particular, for the use of body-tied transistors in critical circuits that require precise control of the body terminal. With the embodiments of the present disclosure, no additional masking steps are required. Accordingly, implementation of the method of the present disclosure can be as simple as a change to a design layout.

The present embodiments also offer various benefits that can include one or more of: 1) reduced gate capacitance and current for such transistors, driven by reduction in gate area, 2) reduced gate to body overlap capacitance and leakage current, 3) ability to couple the embodiments of the method of the present disclosure with a dual gate oxide (DGO) mask in a body-contact region to further reduce capacitance and leakage current, and 4) an ability to minimize gate length in the body-tie region will relax poly-active misalignment requirements, and/or improve mismatch between the source and drain of two transistors with the same layout, 5) provide a reduced external body resistance under the blocked gate, wherein the silicide-block process also blocks out n/p extensions and halo implants.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The various embodiments disclosed herein make use of semiconductor processing techniques known in the art and thus are not described in detail herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a silicon-on-insulator transistor comprising:

providing an insulating layer;

forming an active region overlying the insulating layer, a portion of the active region providing an intrinsic body region;

forming a body tie access region within the active region and also overlying the insulating layer and laterally adjacent the intrinsic body region, the body tie access region making electrical contact to the intrinsic body region;

forming a gate electrode overlying the intrinsic body region for providing electrical control of the intrinsic body region of the silicon-on-insulator transistor and extending over a portion of the body tie access region to minimize parasitic capacitance and gate electrode leakage;

forming halo/extension implants of dopants into the intrinsic body region while substantially blocking the halo/extension implants of dopants from the body tie access region;

forming a sidewall spacer dielectric material adjacent a substantially constant length of the gate electrode and overlying the body tie access region;

forming first and second current electrodes adjacent opposite sides of the intrinsic body region; and forming a body tie diffusion within the active region end laterally offset from the body tie access region and electrically coupled to the body tie access region.

2. The method of claim 1 further comprising:

forming a dielectric layer of the sidewall spacer dielectric material overlying substantially all of the body tie access region including the portion of the gate electrode that overlies the body tie access region.

3. The method of claim 2 further comprising:

doping a portion of the body tie access region that underlies the dielectric layer to increase doping concentration of the body tie access region to substantially minimize formation of a depletion region in the body tie access region.

4. The method of claim 3 wherein the doping further comprises:

using a pattern feature in a first mask as a first selective block for the doping; and reusing the pattern feature in a second mask as a second selective block to provide the dielectric layer.

5. The method of claim 1 further comprising:

minimizing parasitic gate capacitance and current leakage by not extending the gate electrode over more than one-half of the body tie access region.

6. A method of forming a silicon-on-insulator transistor comprising:

forming an insulating substrate;

defining an active region which defines a location of the silicon-on-insulator transistor;

implanting the active region with a predetermined diffusion material to form an intrinsic body region of desired doping concentration;

defining a body tie access region by forming an opening in a mask overlying the active region;

implanting the active region to form the body tie access region, the body tie access region having a predetermined doping concentration to minimize body tie access resistance;

forming a gate oxide overlying both the intrinsic body region and the body tie access region;

depositing and patterning a substantially constant length gate electrode material overlying the intrinsic body region and a portion of the body tie access region;

forming halo/extension implants of dopants into the intrinsic body region while substantially blocking the halo/extension implants of dopants from the body tie access region;

forming sidewall spacer dielectric material overlying the substantially constant length gate electrode material and body tie access region;

masking a region substantially overlying the body tie access region using a mask;

removing the sidewall spacer dielectric material substantially everywhere except overlying the body tie access region and adjacent the substantially constant length gate electrode material;

forming a source diffusion region and a drain diffusion region; and forming a body tie diffusion region.

7. The method of claim 6 further comprising:

forming electrical contact to the source diffusion region, the drain diffusion region, the body tie diffusion and the substantially constant length gate electrode material by forming a silicide layer overlying the source diffusion region, the drain diffusion region, the body tie diffusion and the substantially constant length gate electrode material.

8. The method of claim 6 further comprising:

defining a dimension of the mask used for masking the body tie access region to have a minimum distance necessary to prevent dopants implanted into the source diffusion region and the drain diffusion region from also being implanted into the body tie diffusion and vice versa.

9. The method of claim 6 further comprising:

depositing and forming a conductive material selectively overlying each of the source diffusion region, the drain diffusion region, the substantially constant length gate electrode material and the body tie diffusion region for making electrical contact thereto.

10. The method of claim 9 further comprising:

defining a dimension of the mask to have a value substantially large enough to prevent electrical short circuiting by the silicide contacting each of the source diffusion region, the drain diffusion region, the body tie diffusion region and the substantially constant length gate electrode material.

11. The method of claim 6 further comprising:

forming the gate oxide overlying the body tie access region to have a first thickness that is greater than a second thickness of the gate oxide overlying the intrinsic body region by using the mask.

12. The method of claim 6 further comprising:

extending the substantially constant length gate electrode material to overlie less than one-half of the body tie access region.

* * * * *